(12) United States Patent
Yang et al.

(10) Patent No.: US 8,076,209 B2
(45) Date of Patent: Dec. 13, 2011

(54) METHODS FOR FABRICATING MOS DEVICES HAVING HIGHLY STRESSED CHANNELS

(75) Inventors: Frank Bin Yang, Mahwah, NJ (US); Rohit Pal, Fishkill, NY (US); Michael J. Hargrove, Clinton Corners, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/771,948

(22) Filed: Apr. 30, 2010

(65) Prior Publication Data

US 2010/0210084 A1    Aug. 19, 2010

Related U.S. Application Data

(62) Division of application No. 12/240,682, filed on Sep. 29, 2008, now Pat. No. 7,767,534.

(51) Int. Cl.
   *H01L 21/336* (2006.01)
(52) U.S. Cl. ........ 438/299; 438/269; 438/369; 257/288; 257/369
(58) Field of Classification Search .................. 438/269, 438/299, 369, 595; 257/288, 369, E27.108, 257/E21.632
   See application file for complete search history.

(56) References Cited

U.S. PATENT DOCUMENTS

| | | | | |
|---|---|---|---|---|
| 7,226,820 B2 * | 6/2007 | Zhang et al. | ............... | 438/149 |
| 7,462,524 B1 * | 12/2008 | Peidous et al. | ............... | 438/197 |
| 2005/0260808 A1 | 11/2005 | Chen et al. | | |
| 2008/0220574 A1 | 9/2008 | Jeng et al. | | |
| 2009/0032881 A1 * | 2/2009 | Lee et al. | ............... | 257/369 |
| 2009/0090941 A1 * | 4/2009 | Tamura | ............... | 257/288 |
| 2009/0289284 A1 | 11/2009 | Goh et al. | | |

OTHER PUBLICATIONS

Ang, K.W., et al. "Strained n-MOSFET With Embedded Source/Drain Stressors and Strain-Transfer Structure (STS) for Enhanced Transistor Performance," IEEE Transactions on Electronic Devices, vol. 55, No. 3, Mar. 2008. pp. 850-857.
Auth, C., et al "45nm High-k+ Metal Gate Strain-Enhanced Transistors," 2008 Symposium on VLSI Technology Digest of Technical Papers, Piscataway, NJ, Jun. 17, 2008. pp. 128-129.
Gehring, A., et al. "Material Choice for Optimum Stress Memorization in SOI CMOS Processes," IDSRS 2007, College Park, Maryland, Dec. 12-14, 2007. pp. 1-2.
Horstmann, M., et al. "Integration and Optimization of Embedded-SiGe, Compressive and Tensile Stressed Liner Films, and Stress Memorization in Advanced SOI CMOS Technologies," International Electron Devices Meeting, Piscataway, NJ, Dec. 5-7, 2005. pp. 233-36.

(Continued)

*Primary Examiner* — Phuc Dang
(74) *Attorney, Agent, or Firm* — Ingrassia Fisher & Lorenz, P.C.

(57) ABSTRACT

Methods for forming a semiconductor device comprising a silicon-comprising substrate are provided. One exemplary method comprises depositing a polysilicon layer overlying the silicon-comprising substrate, amorphizing the polysilicon layer, etching the amorphized polysilicon layer to form a gate electrode, etching recesses into the substrate using the gate electrode as an etch mask, depositing a stress-inducing layer overlying the gate electrode, annealing the silicon-comprising substrate to recrystallize the gate electrode, removing the stress-inducing layer, and epitaxially growing impurity-doped, silicon-comprising regions in the recesses.

20 Claims, 18 Drawing Sheets

OTHER PUBLICATIONS

Morin, P., et al. "Mechanisms of Stress Generation Within a Polysilicon Gate for nMOSFET Performance Enhancement," Materials Science & Engineering B vol. 135 No. 3 Dec. 15, 2006. pp. 215-19.

Wang, X., et al. "Progress in Modeling of SMT 'Stress Memorization Technique' and Prediction of Stress Enhancement by a Novel PMOS SMT Process," International Conference on Simulation of Semiconductor Processes and Devices, Sep. 9, 2008. pp. 117-120.

Wei, A., et al. "Multiple Stress Memorization in Advanced SOI CMOS Technologies," VLSI Technology, 2007 IEEE Symposium on, Jun. 1, 2007. pp. 216-17.

Yeo, Y-C. "Enhancing CMOS Transistor Performance Using Lattice-Mismatched Materials in Source/Drain Regions," Semiconductor Science and Technology, vol. 22, Dec. 7, 2006. pp. S177-S182.

International Search Report for PCT/US2009/058629 mailed Feb. 22, 2010.

* cited by examiner

METHODS FOR FABRICATING MOS DEVICES HAVING HIGHLY STRESSED CHANNELS

CROSS-REFERENCE TO RELATED APPLICATIONS

This is a division of application Ser. No. 12/240,682, filed Sep. 29, 2008 U.S. Pat. No. 7,767,534.

FIELD OF THE INVENTION

The present invention relates to methods for fabricating semiconductor devices, and more particularly relates to methods for fabricating metal oxide semiconductor devices having highly stressed channels.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode disposed overlying a semiconductor substrate and spaced apart source and drain regions disposed within the substrate and between which a current can flow. A control voltage applied to the gate electrode controls the flow of current through a channel within the substrate between the source and drain regions.

It is well known that the performance of a transistor device can be improved by applying an appropriate stress to the channel region to enhance the mobility of majority carriers. For example, the mobility of electrons, the majority carrier in an N-channel MOS (NMOS) transistor can be increased by applying a tensile longitudinal stress to the channel. Similarly, the mobility of holes, the majority carrier in a P-channel MOS (PMOS) transistor, can be increased by applying a compressive longitudinal channel stress. Tensile and compressive stress liner films have been incorporated as channel stress-inducing layers for both NMOS and PMOS devices, respectively, for the 65 nm, 45 nm, and 32 nm technology nodes. However, because the thickness of these films decreases with device pitch, the stress applied, and thus the performance benefit achieved, also declines with each new technology generation.

Accordingly, it is desirable to provide methods for fabricating MOS devices having highly stressed channels. Further, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with exemplary embodiments of the invention, methods for forming a semiconductor device comprising a silicon-comprising substrate are provided. One exemplary method comprises depositing a polysilicon layer overlying the silicon-comprising substrate, amorphizing the polysilicon layer, etching the amorphized polysilicon layer to form a gate electrode, depositing a stress-inducing layer overlying the gate electrode, annealing the silicon-comprising substrate to recrystallize the gate electrode, removing the stress-inducing layer, etching recesses into the substrate using the gate electrode as an etch mask, and epitaxially growing impurity-doped, silicon-comprising regions in the recesses.

In accordance with another exemplary embodiment of the invention, a method is provided for fabricating an MOS transistor on and within a silicon-comprising substrate having a first surface. The method comprises depositing a polysilicon layer overlying the first surface of the silicon-comprising substrate, amorphizing the polysilicon layer, forming a gate stack comprising a gate electrode fabricated from the polysilicon layer and having sidewalls, the gate stack disposed overlying the first surface of the silicon-comprising substrate, forming offset spacers adjacent the sidewalls of the gate electrode, depositing a stress-inducing silicon nitride layer overlying the gate stack, the offset spacers, and the first surface, annealing the silicon-comprising substrate, removing the stress-inducing silicon nitride layer, etching the first surface of the silicon-comprising substrate using the gate stack and the offset spacers as an etch mask to form recesses in the silicon-comprising substrate, the step of etching performed after the step of removing, and epitaxially forming impurity-doped, silicon-comprising regions in the recesses.

In accordance with yet another exemplary embodiment of the invention, a method is provided for fabricating an MOS transistor on and within a silicon-comprising substrate having a first surface. The method comprises depositing a polysilicon layer overlying the first surface of the silicon-comprising substrate, amorphizing the polysilicon layer, forming a gate stack comprising a gate electrode fabricated from the polysilicon layer and having sidewalls, the gate stack disposed overlying the first surface of the silicon-comprising substrate, forming offset spacers adjacent the sidewalls of the gate electrode, etching the first surface of the silicon-comprising substrate using the gate stack and the offset spacers as an etch mask to form recesses in the silicon-comprising substrate, the recesses exposing second surfaces of the silicon-comprising substrate, depositing a stress-inducing silicon nitride layer overlying the gate stack, the offset spacers, and the second surfaces, annealing the silicon-comprising substrate, removing the stress-inducing silicon nitride layer; and epitaxially forming impurity-doped, silicon-comprising regions in the recesses.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Methods for fabricating MOS devices with highly stressed channels are provided herein. The methods can be utilized at technology nodes up to 32 nm and beyond to increase the performance of transistor devices formed in accordance therewith. The various embodiments of the present invention result in longitudinally-oriented tensile stress and vertically-oriented compressive stress in the channels of NMOS devices, and longitudinally-oriented compressive and vertically-oriented tensile stress in the channels of PMOS devices. In NMOS devices, epitaxially-grown eSi:C source and drain stressor films are integrated with deposited sacrificial stress-inducing layers to provide an additive stressing effect that enhances the resulting longitudinal tensile/vertical compressive stress over either technique used alone. In PMOS devices, epitaxially-grown eSi:Ge source and drain stressor films are integrated with sacrificial compressive stress-inducing layers to provide enhanced longitudinal compressive/vertical tensile stress. These methods include a novel combination of stress-inducing processes that may be used together without compromising the individual stress contributions of either process.

FIGS. 1-12 illustrate schematically, in cross section, a method for forming an MOS transistor 100 in accordance with an exemplary embodiment of the invention. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a silicon-comprising substrate. The embodiments herein described refer to both an N-channel MOS (NMOS) transistor, and a P-channel MOS (PMOS) transistor. While the fabrication of only one MOS transistor is illustrated, it will be appreciated that the method depicted in FIGS. 1-12 can be used to fabricate any number of such transistors. Various steps in the manufacture of MOS components are well known and so, in the interest of brevity, many conventional steps will only be mentioned briefly herein or will be omitted entirely without providing the well known process details.

Figure 1:
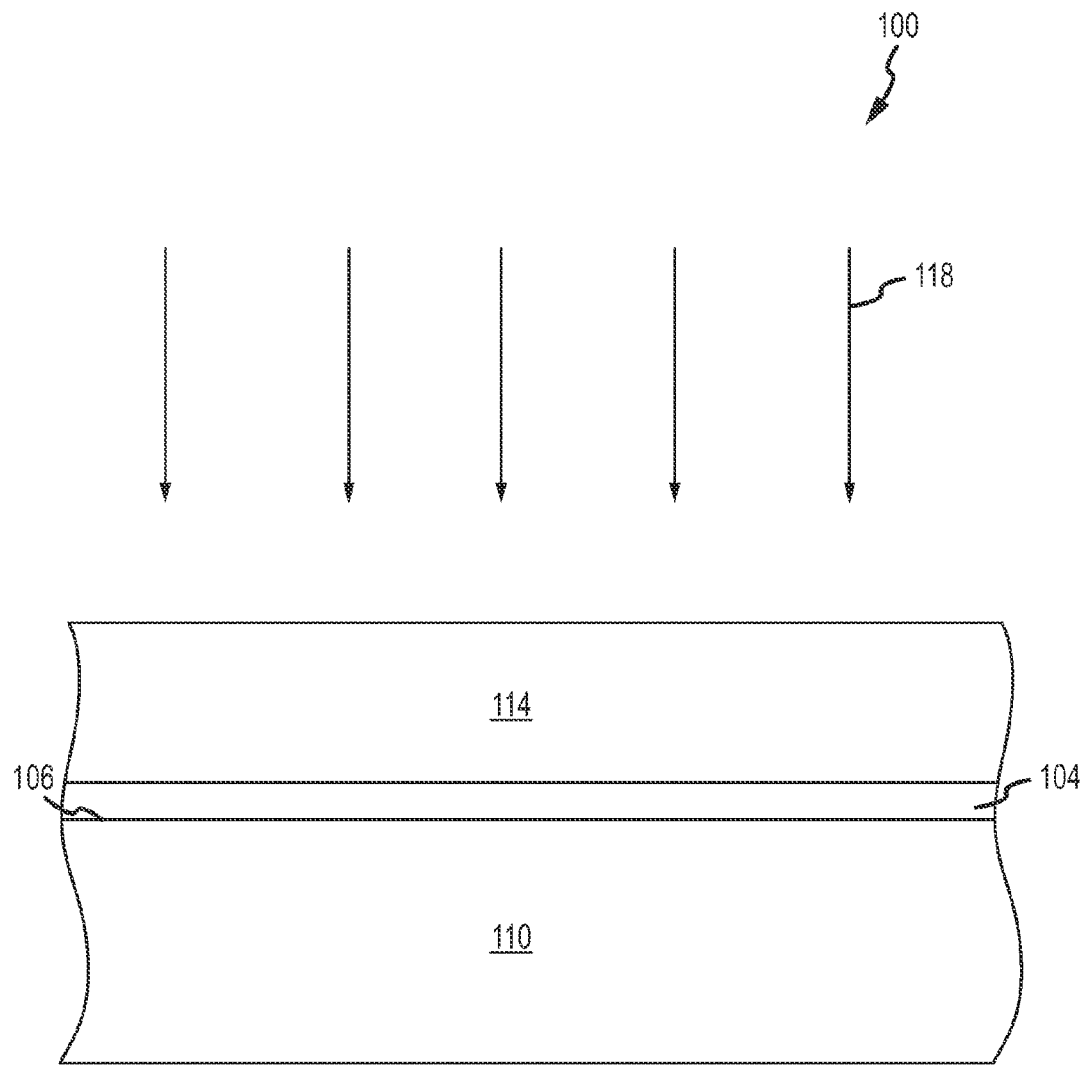
FIGS. 1-12 schematically illustrate, in cross-section, a method of fabricating an MOS transistor in accordance with an exemplary embodiment of the present invention.

Referring to FIG. 1, the method begins by forming a gate insulator layer 104 overlying a silicon substrate 110. The term "silicon substrate" is used herein to encompass the relatively pure silicon materials typically used in the semiconductor industry as well as silicon admixed with other elements such as germanium, carbon, and the like. The silicon substrate may be a bulk silicon wafer, or may be a thin layer of silicon on an insulating layer (commonly know as silicon-on-insulator or SOI) that, in turn, is supported by a carrier wafer. At least a surface region 106 of the silicon substrate is impurity doped, for example by forming N-type well regions and P-type well regions for the fabrication of PMOS transistors and NMOS transistors, respectively. If the silicon substrate is of the SOI type, the thickness of the thin silicon layer preferably is sufficient such that the epitaxial deep source and drain regions, described in greater detail below, are separated from the insulating layer by at least about 10 nm.

Typically, the gate insulating layer 104 can comprise a thermally grown silicon dioxide or, alternatively (as illustrated), a deposited insulator such as a silicon oxide, silicon nitride, $HfO_2$, $Al_2O_3$, or the like. Deposited insulators can be deposited, for example, by chemical vapor deposition (CVD), low pressure chemical vapor deposition (LPCVD), or plasma enhanced chemical vapor deposition (PECVD). Gate insulator layer 104 preferably has a thickness of about 1-10 nm, although the actual thickness can be determined based on the application of the transistor in the circuit being implemented.

A gate electrode layer 114 is formed overlying the gate insulating layer 104 and, in accordance with one embodiment of the invention, comprises undoped polycrystalline silicon. Gate electrode layer 114 can be deposited by LPCVD by the hydrogen reduction of silane ($SiH_4$), and has a thickness in the range of from about 50 nm to about 100 nm, and preferably is about 70 nm thick. The morphology of gate layer 114 is then transformed from polycrystalline to amorphous using a high energy ion implantation process. In one exemplary embodiment, ions (represented by arrows 118) of either xenon (Xe), germanium (Ge), or silicon (Si) are implanted into gate electrode layer 114. In another exemplary embodiment, the ions are implanted using an accelerating voltage of from about 3 keV to about 20 keV, and a dose ranging from about $1\times10^{14}$ $cm^{-2}$ to about $5\times10^{15}$ $cm^{-2}$. The particular energy and dose used to amorphize gate electrode layer 114 will depend accordingly upon the thickness of this layer.

Figure 2:
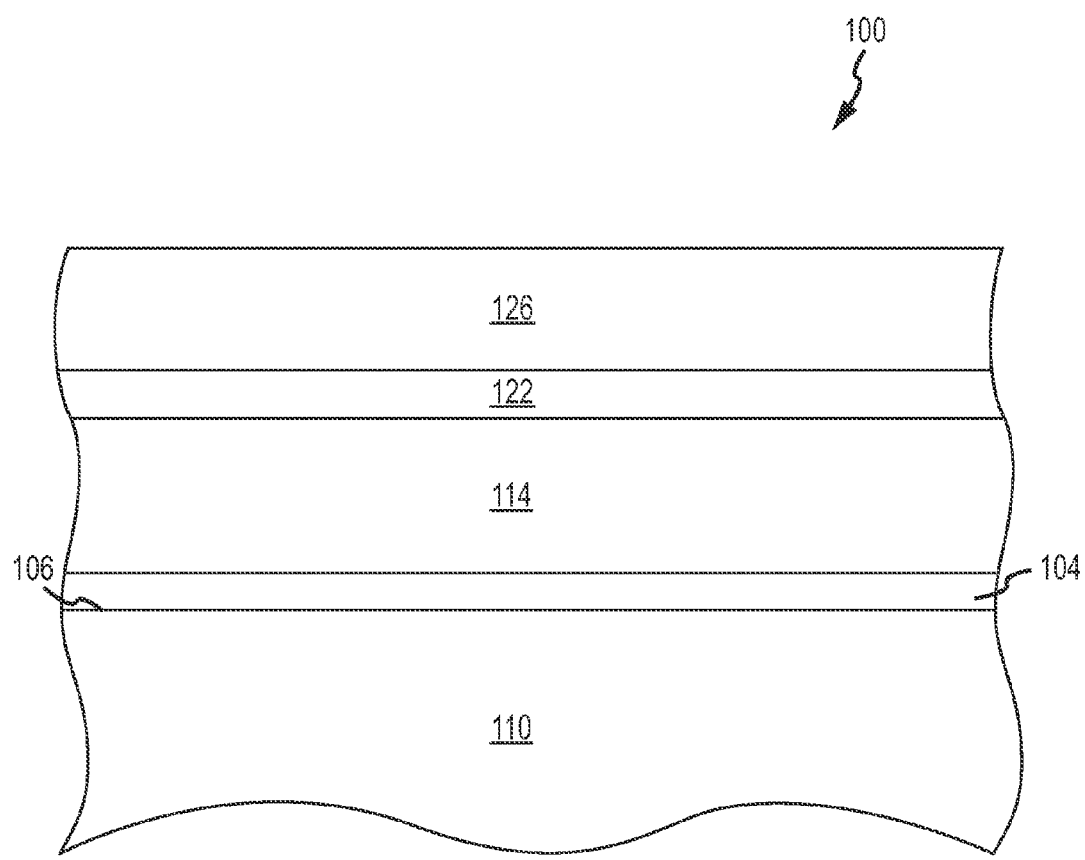

Referring to FIG. 2, an oxide capping layer 122 comprising silicon oxide is deposited overlying gate electrode layer 114. Oxide capping layer 122 is deposited using a low temperature deposition process so as to avoid recrystallization of the amorphized gate electrode layer 114. For example, oxide capping layer 122 may be deposited via an LPCVD process using either $SiH_4$ or tetraethylorthosilicate $Si(OC_2H_5)_4$ (TEOS). Alternatively, a PECVD process may be used with $SiH_4$ and either oxygen ($O_2$) or nitrous oxide ($N_2O$) as reactants. The thickness of oxide capping layer 122 is in a range of from about 5 to about 10 nm, and is preferably about 8 nm thick. Next, a nitride capping layer 126 comprising silicon nitride ($Si_3N_4$) is deposited overlying oxide capping layer 122. The nitride capping layer 126 also is deposited using a low temperature deposition process so as to avoid recrystallization of the amorphized gate electrode layer 114, and may be deposited, for example, by a PECVD process using $SiH_4$ and ammonia ($NH_3$) or nitrogen ($N_2$) in the presence of an argon (Ar) plasma. The thickness of nitride capping layer 126 is in a range of from about 10 nm to about 50 nm and preferably is from about 20 nm to about 40 nm thick.

Figure 3:
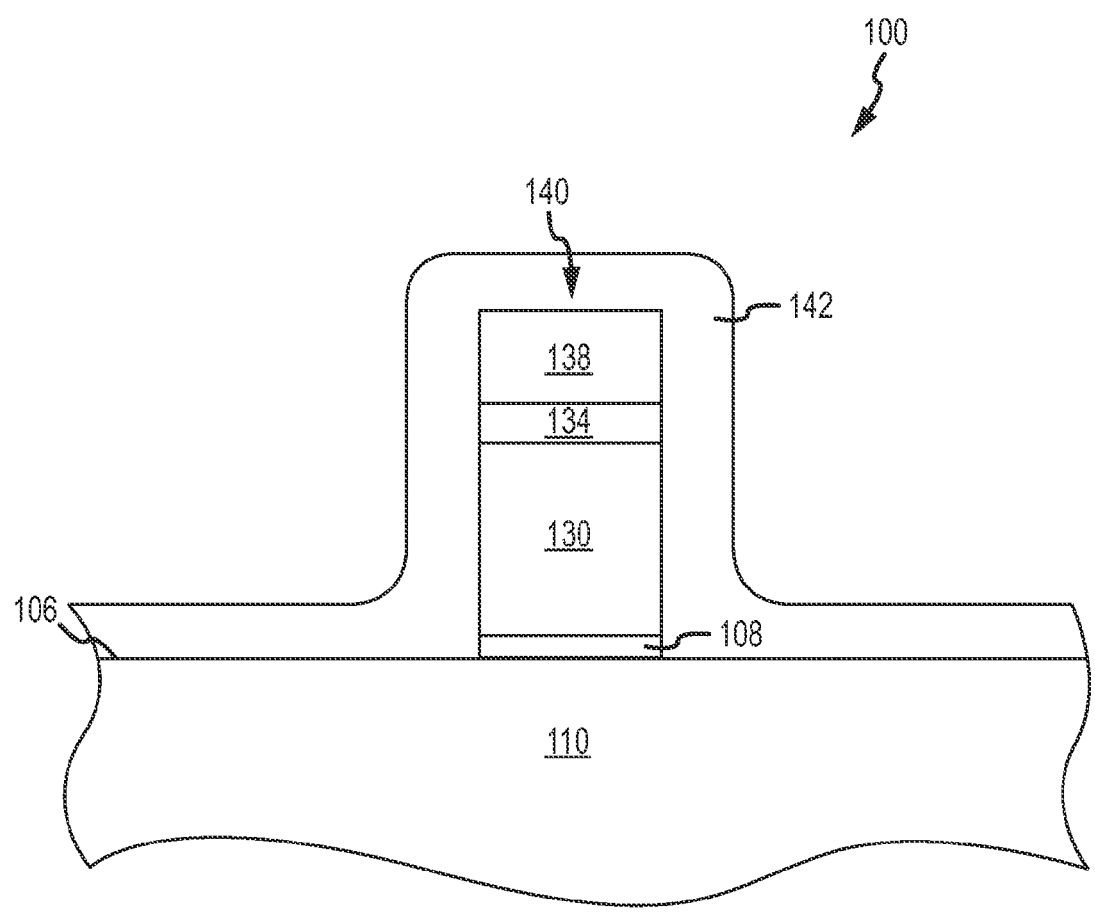

Referring to FIG. 3, nitride capping layer 126 is patterned using a photolithography and reactive ion etch (RIE) sequence to form a nitride cap 138. Nitride capping layer 126 may be etched, for example, by using a carbon trifluoride/oxygen ($CHF_3/O_2$) plasma chemistry. Following this etch, oxide capping layer 122, gate electrode layer 114, and gate insulator layer 104 are sequentially anisotropically etched using nitride cap 138 and/or any remaining photoresist as an etch mask. For each layer, selective etch processes are used to minimize erosion of nitride cap 138, and may include a $CHF_3$, $CF_4$, or $SF_6$ chemistry for etching oxide capping layer 122 and gate insulator layer 104, and a CY or $HBr/O_2$ chemistry for etching gate electrode layer 114. When these etches are completed, a gate stack 140 is formed comprising a gate insulator 108, a gate electrode 130, an oxide cap 134, and nitride cap 138. Next, any remaining photoresist is removed and a first dielectric layer 142 comprising silicon oxide is conformably blanket deposited overlying MOS transistor 100.

Figure 4:
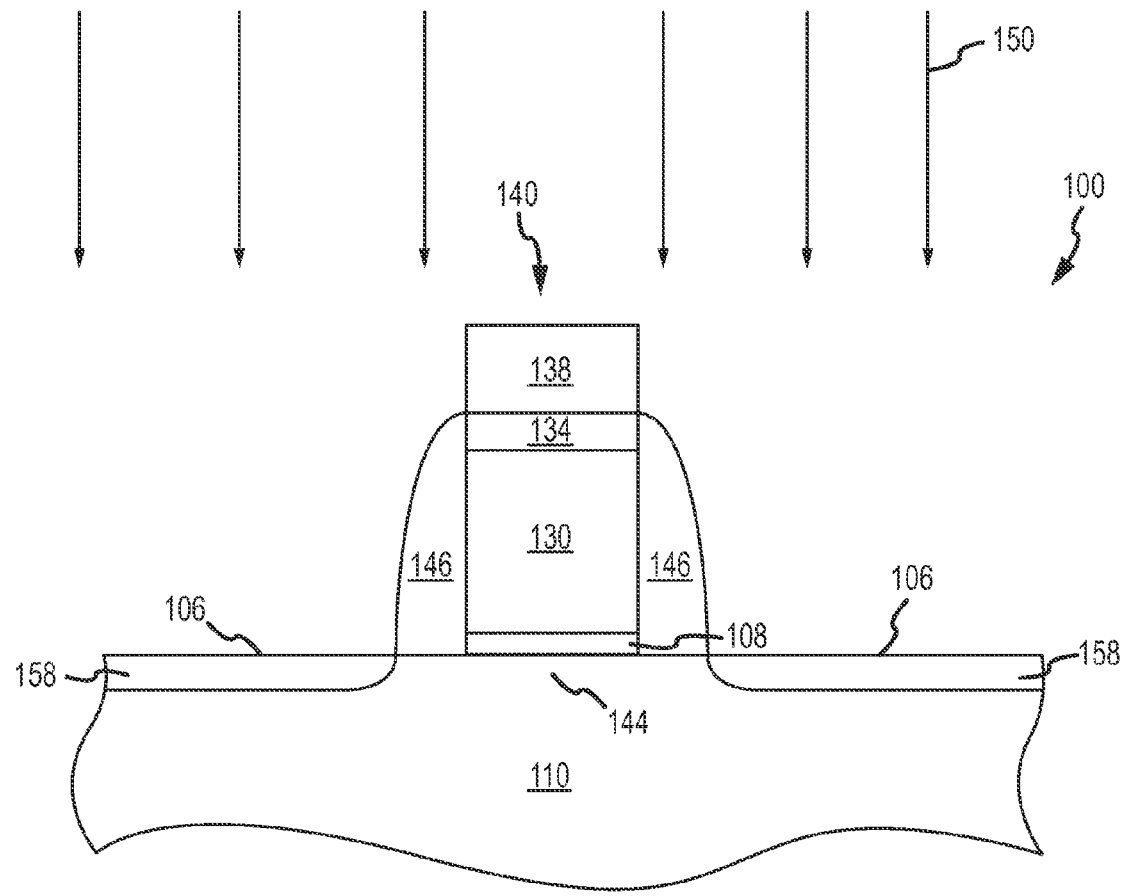
Figure 5:
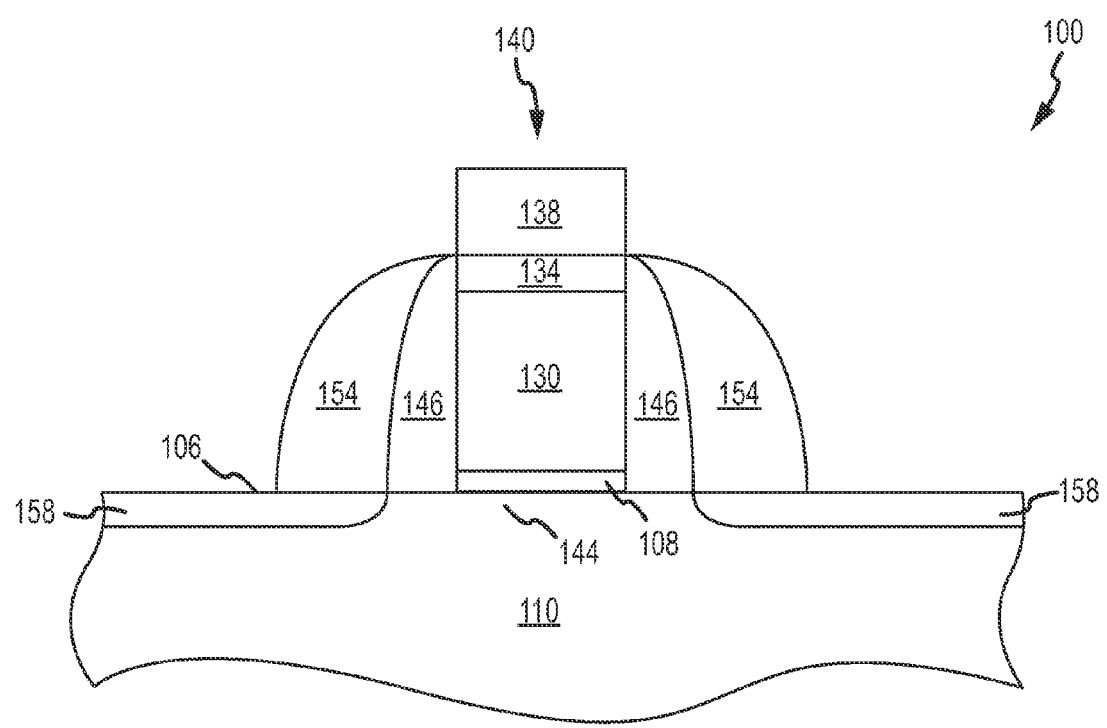

Next, first dielectric layer 142 is anisotropically etched using the methods as described above for etching oxides and nitrides to form offset spacers 146 along the sidewalls of gate stack 140, as illustrated in FIG. 4. Offset spacers 146 are formed using low temperature deposition and etch processes to avoid recrystallization of amorphized polysilicon gate electrode 130. For this reason, sidewall spacers formed using a high temperature processes such as by thermal oxidative growth along the sidewalls of gate electrode 130 are avoided. Offset spacers 146 are etched to a final thickness at their base in the range of from about 10 nm to about 20 nm. Following the formation of offset spacers 146, source and drain extensions 158 are formed by impurity doping substrate 110, for example, by ion implantation of dopant ions (illustrated by arrows 150) appropriate to the polarity of MOS transistor 100. Gate stack 140 and offset spacers 146 are used as an implantation mask to provide self-alignment of extensions 158. The separation of extensions 158 from a gate channel 144 can be adjusted by altering the targeted thickness of offset spacers 146 by performing more or less etching as previously described. For an N-channel MOS transistor, source and drain extensions 158 are preferably formed by implanting arsenic (As) ions, although phosphorus (P) ions may also be used. The accelerating voltage used for this implantation process is in a range of from about 2 to about 5 keV, and the dose is in a range of from about $1 \times 10^{15}$ cm$^{-2}$ to about $5 \times 10^{15}$ cm$^{-2}$. For a P-channel MOS transistor, source and drain extensions 158 are preferably formed by implanting boron (B) ions. An accelerating voltage of from about 0.5 to about 3 keV and a dose of from about $1 \times 10^{15}$ cm$^{-2}$ to about $5 \times 10^{15}$ cm$^{-2}$ are used. MOS transistor 100 may then be cleaned to remove any oxide that has formed on the surface 106 of silicon substrate 110 using, for example, dilute hydrofluoric acid. After the formation of source and drain extensions 158, a disposable spacer layer comprising silicon nitride is blanket deposited overlying MOS transistor 100, and is anisotropically etched, as described above, to form second spacers 154, often referred to as disposable spacers, adjacent to offset spacers 146, as illustrated in FIG. 5. In one exemplary embodiment, disposable spacers 154 are etched to have a final thickness at their base of from about 10 nm to about 30 nm.

Figure 6:
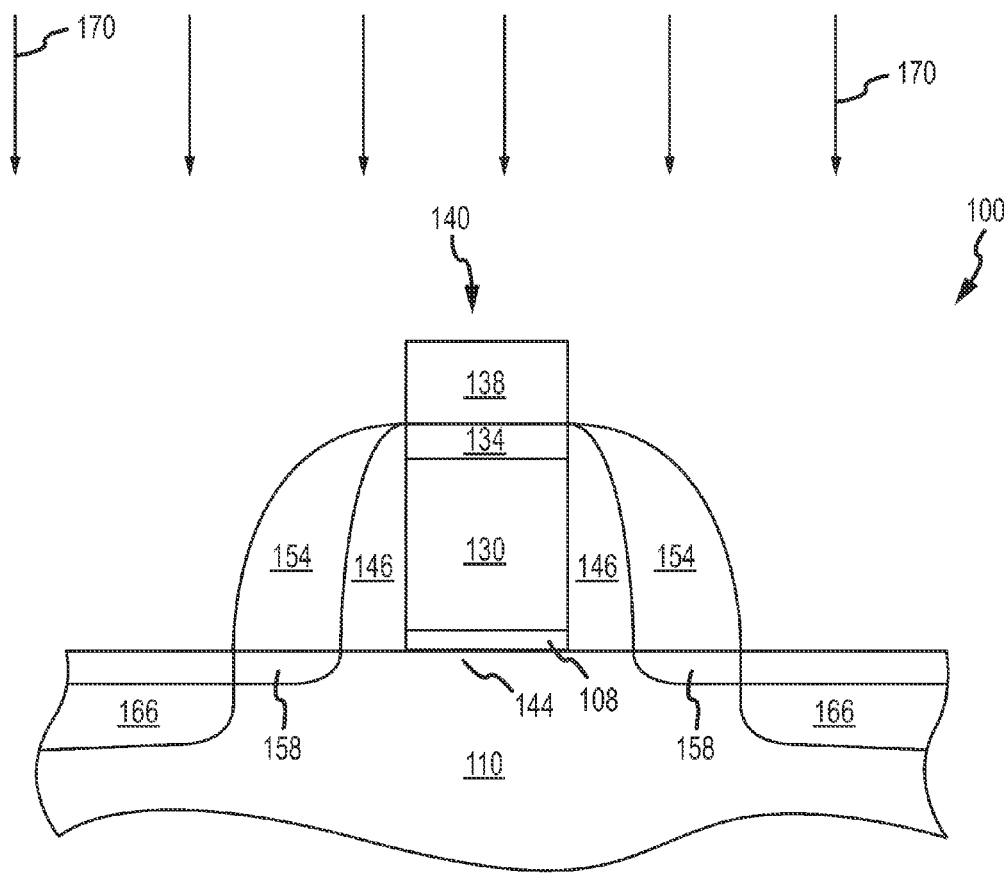

In an optional embodiment illustrated in FIG. 6, first deep source and drain regions 166 are formed by implanting impurity dopant ions (represented by arrows 170), such as phosphorous or arsenic ions for an NMOS transistor, or boron ions for a PMOS transistor, into the surface of substrate 110. First regions 166 are defined self-aligned to gate stack 140 by implanting ions 170 using disposable spacers 154, offset spacers 146, and gate stack 140 as an implant mask. The accelerating voltage used for this implantation process for NMOS devices is in a range of from about 10 to about 30 keV, while for PMOS the voltage ranges from about 0.5 to about 3 keV. The dose used for both NMOS and PMOS devices is in a range of from about $1 \times 10^{15}$ cm$^{-2}$ to about $5 \times 10^{15}$ cm$^{-2}$.

Figure 7:
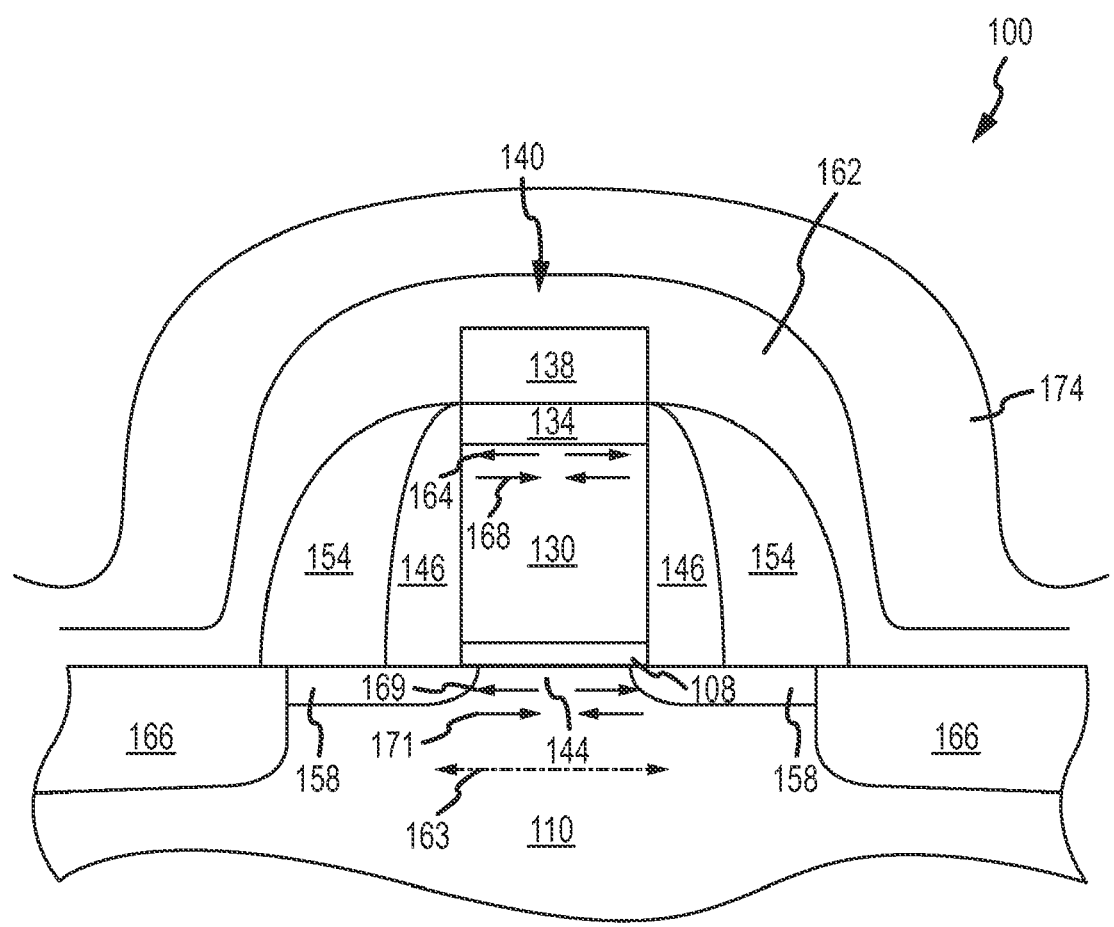

The method continues as illustrated in FIG. 7 by blanket depositing an oxide liner 162 comprising silicon oxide over MOS transistor 100. In one exemplary embodiment, oxide liner 162 is deposited using a low temperature CVD or PECVD process. Next, a stress-inducing layer 174 comprising silicon nitride is deposited overlying oxide liner 162 using a low temperature deposition process such as previously described. Stress-inducing layer 174 has a thickness in a range of from about 30 nm to about 70 nm, and is preferably about 50 nm thick. For an NMOS device, stress-inducing layer 174 is applied using a CVD, LPCVD, or PECVD process that results in a tensile stress-inducing film that subjects gate electrode 130 to tensile forces (represented by arrows 164) substantially parallel to a longitudinal axis 163 of MOS transistor 100. For a PMOS device, stress-inducing layer 174 is applied using a CVD, LPCVD, or PECVD process that results in a compressive stress-inducing film that subjects gate electrode 130 to compressive forces (represented by arrows 168) substantially parallel to longitudinal axis 163. As is well known by those having skill in the art, stress in deposited silicon nitride films can be modified by adjusting the operating conditions of the vapor deposition process including temperature, pressure, and gas ratios to achieve a film having the desired tensile or compressive stress properties.

Figure 8:
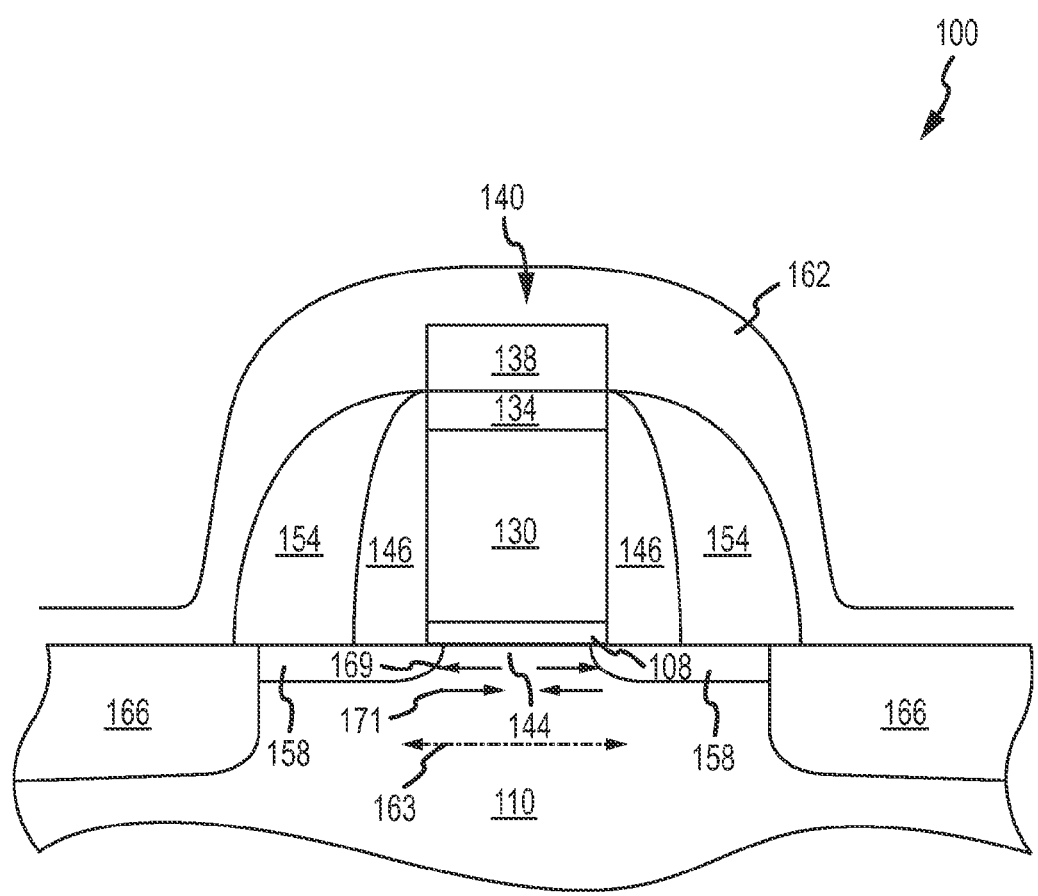

MOS transistor 100 is then subjected to a high temperature anneal using, for example, rapid thermal annealing (RTA) or laser annealing. The anneal temperature ranges from about 1000° C. to about 1300° C. for a time of from about a 2 nano seconds to about 3 seconds, and activates the dopants implanted into extensions and first deep source and drain regions 158 and 166, respectively. The annealing process also expands both regions somewhat as dopants diffuse downward into substrate 110 and toward channel 144. Further, during this anneal, the morphology of gate electrode 130, stressed by the overlying stress-inducing layer 174 either tensily (for NMOS) or compressively (for PMOS), is transformed from an amorphous state to a polycrystalline state, resulting in a volume increase or decrease, respectively. When gate electrode 130 cools after annealing, the volume change generates similar tensile stresses 169 or compressive stresses 171 that are transferred through gate insulator 108 to channel region 144. Therefore, the tensile or compressive stress, originally generated by stress-inducing layer 174, is transferred to gate electrode 130 and channel 144 during the annealing/recrystallization process and remains fixed (memorized) in channel 144 after stress-inducing layer 174 has been removed. Stress-inducing layer 174 then is removed as illustrated in FIG. 8 using, for example, a hot phosphoric acid/water mixture having a volumetric ratio of about 1:3 to about 1:10, and a temperature of from about 120° C. to about 160° C. Oxide liner 162 serves as an etch stop, shielding nitride cap 138, disposable spacers 154, and any otherwise exposed surface region of MOS transistor 100 from erosion. Oxide liner 162 then is removed using a dilute or buffered hydrofluoric acid solution.

Figure 9:
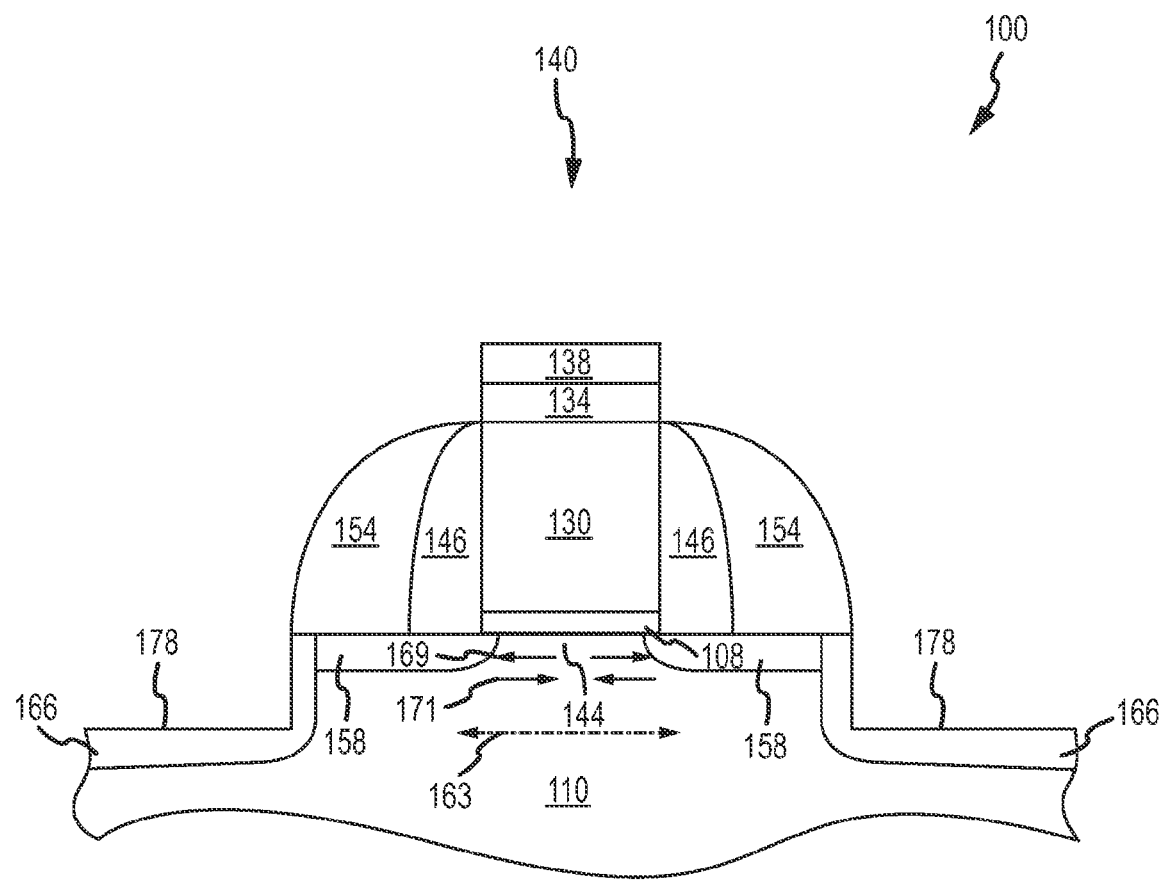

Referring to FIG. 9, recesses 178 are anisotropically etched into the silicon substrate 110 proximate to gate stack 140 using gate stack 140 and disposable spacers 154 as an etch mask. During this etch, the thickness of nitride cap 138 is reduced and disposable spacers 154 are also somewhat eroded. The recesses can be etched by, for example, reactive ion etching (RIE) using an HBr/O$_2$ chemistry. According to one exemplary embodiment, recesses 178 are etched to a depth of from about 50 nm to about 100 nm, and preferably to about 60 nm. In another exemplary embodiment, recesses 178 are etched to a depth such that a portion of first deep source and drain regions 166 remains surrounding recesses 178. The strain created by tensile or compressive stresses 169 and 171 memorized within channel 144 may be further enhanced by the removal of supportive material adjacent to channel 144 during the formation of recesses 178. This is in contrast to conventional stress memorization techniques (SMT) wherein recesses 178 are not formed and, thus, the supportive material adjacent to channel 144 remains. In the various embodiments of the present invention, the formation of recesses 178 removes this supportive material and, accordingly, may help to realize additional strain within channel 144.

Figure 10:
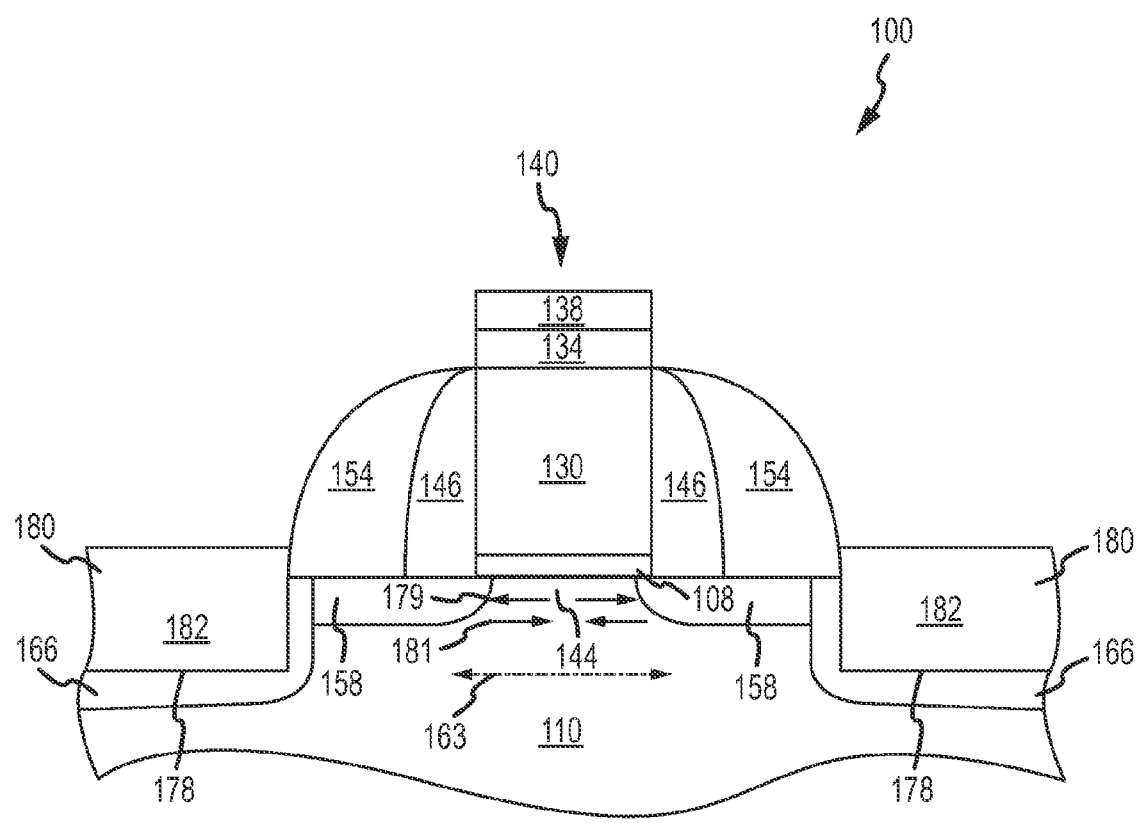

Referring to FIG. 10, a silicon-comprising film 182 is epitaxially grown in recesses 178 to form epitaxially-grown source and drain regions 180. The epitaxial process is performed selectively to silicon surfaces so that growth on non-silicon surfaces such as disposable spacers 154 or nitride cap 138 is prevented. The epitaxial silicon-comprising film 182 can be grown by the reduction of silane (SiH$_4$) or dichlorosilane (SiH$_2$Cl$_2$) in the presence of hydrochloric acid (HCl) to control growth selectivity. In one exemplary embodiment, in addition to the epitaxial-growth reactants, impurity-doping elements are provided to appropriately in situ dope epitaxially-grown source and drain regions 180 as the silicon-comprising film 182 is grown. For example, boron can be added to the reactants during the epitaxial growth of deep source/drain regions for PMOS applications, and arsenic or phosphorous can be added to the reactants during epitaxial growth for NMOS applications.

In an alternative embodiment, the silicon-comprising film 182 may be epitaxially grown in the presence of additional stress-inducing elements such as, for example, carbon or germanium, to incorporate them thereby into the crystalline lattice. In one exemplary embodiment, embedded silicon germanium (eSi:Ge) preferably is used to apply a compressive stress (represented by arrows 181) to channel 144 of a PMOS transistor. In another embodiment, the eSi:Ge includes up to about 40% germanium, and preferably contains from about 25% to about 35% germanium. In another exemplary embodiment, epitaxially-grown source and drain regions 180 of an NMOS transistor may be fabricated in a similar manner by epitaxially growing a monocrystalline embedded silicon carbon (eSi:C) that applies a tensile stress (represented by arrows 179) to channel 144. In yet a further embodiment, the epitaxial eSi:C film 182 includes up to about 3% carbon and preferably includes about 2% carbon. Tensile and compressive stresses 179 and 181 may be additive to stresses 169 and 171, respectively, of FIGS. 7-9 to enhance the total stress imparted to channel 144. Following epitaxial growth, nitride cap 138 and disposable spacers 154 are removed using a hot phosphoric acid etch described above.

Figure 11:
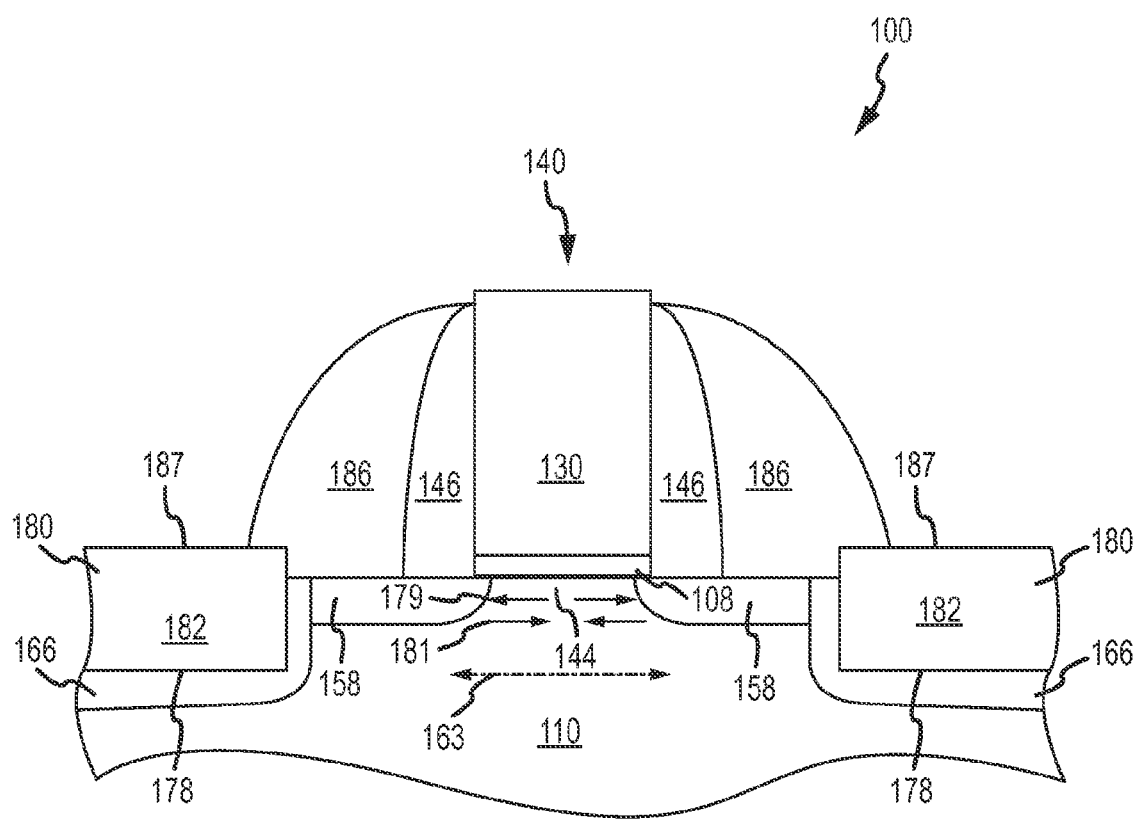
Figure 12:
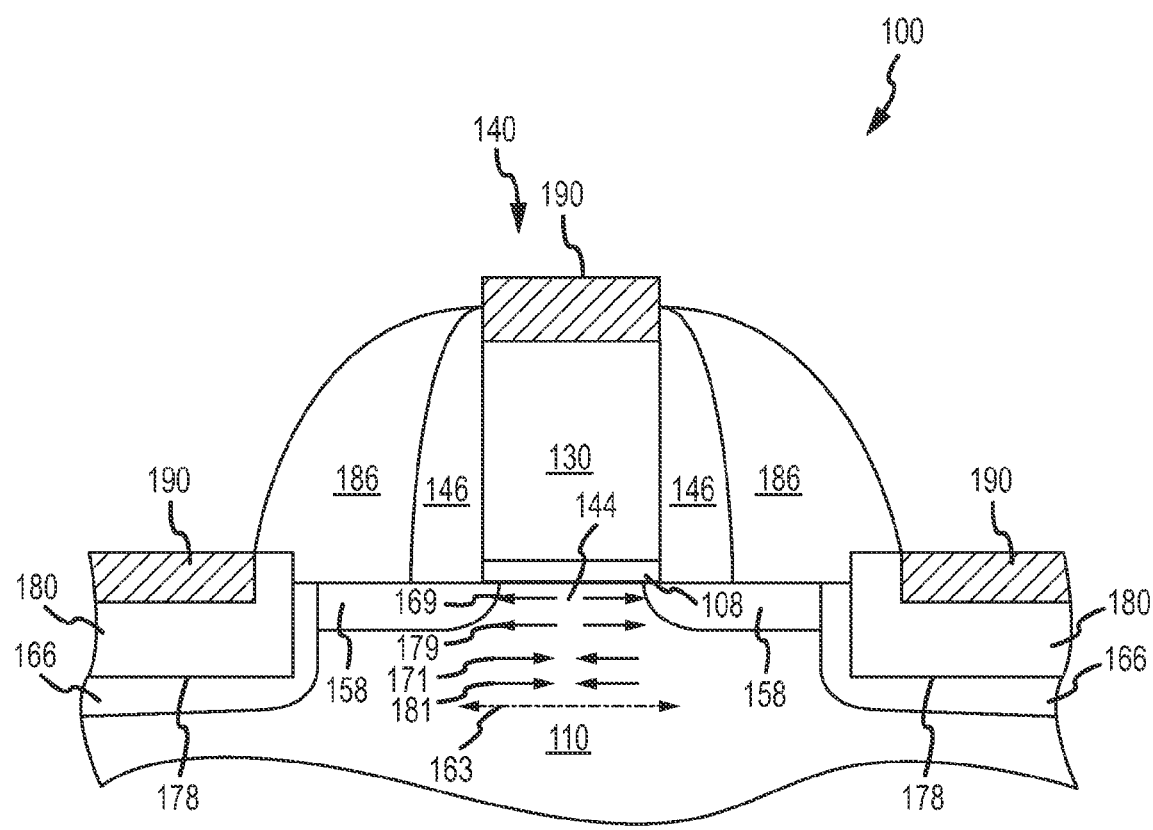

Referring to FIG. 11, final spacers 186 comprising silicon nitride are formed about the sidewalls of offset spacers 146 by applying a blanket film of silicon nitride overlying transistor 100 followed by an anisotropic nitride etch as previously described. Final spacers 186 have a thickness at their base in a range of from about 30 nm to about 50 nm or are preferably about 40 nm thick. A wet etchant comprising dilute or buffered hydrofluoric acid is used subsequently to remove oxide cap 134 and clean the surfaces 187 of silicon-comprising film 182 by removing any surface oxides that may have formed. Metal silicide contact regions 190 may then be formed using well known metal deposition, annealing, and metal etching processes to provide electrical connections to gate electrode 130 and epitaxially-grown source and drain regions 180 of MOS transistor 100, as illustrated in FIG. 12.

Figure 13:
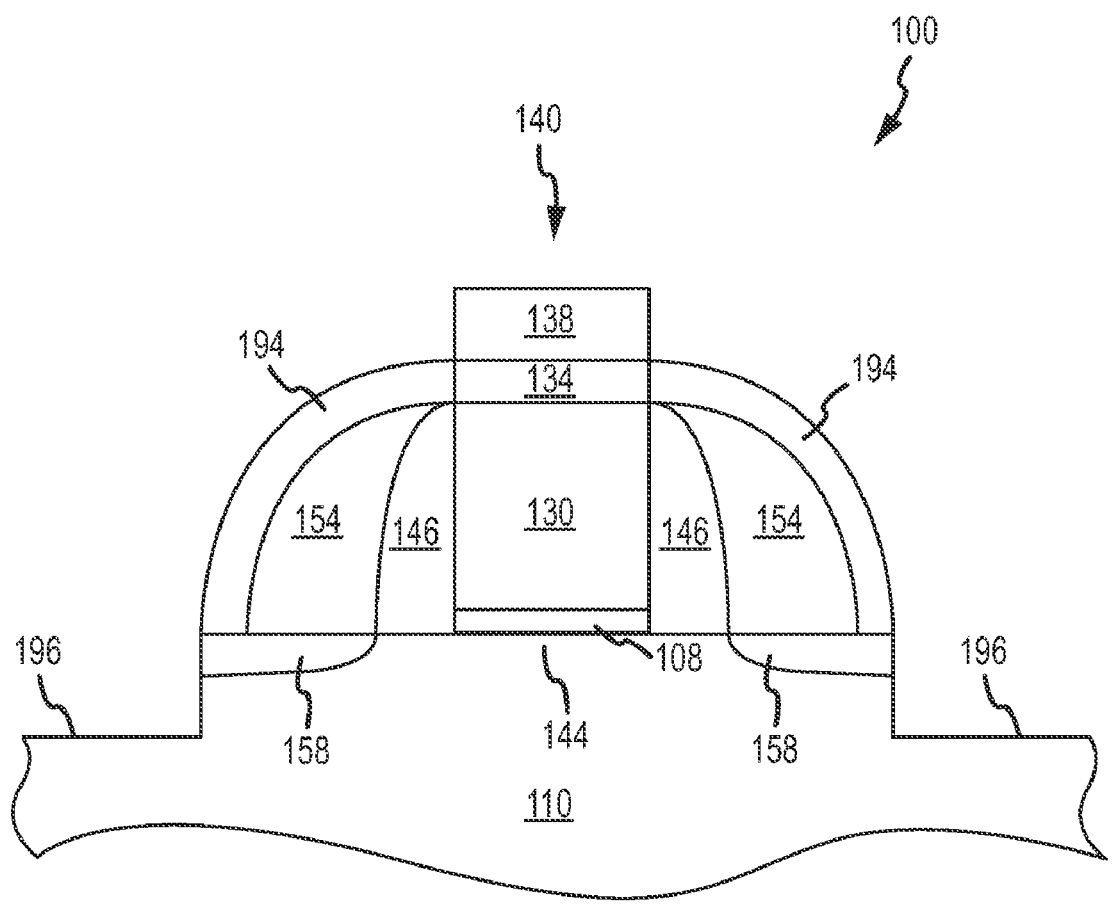
FIGS. 13-18 schematically illustrate, in cross-section, a method of fabricating an MOS transistor in accordance with another exemplary embodiment of the present invention.

FIGS. 13-18 illustrate, in cross-section, a method for forming an MOS transistor 100 in accordance with another exemplary embodiment of the present invention. The method illustrated in FIGS. 13-18 utilizes the steps illustrated in FIGS. 1-5 and therefore, for the sake of brevity, those steps will not be repeated herein. Accordingly, after the formation of silicon nitride disposable spacers 154 of FIG. 5, oxide spacers 194 are formed overlying disposable spacers 154, as illustrated in FIG. 13. Oxide spacers 194 are formed using a low temperature CVD, LPCVD, or PECVD silicon oxide blanket deposition process followed by an anisotropic etch selective to oxide to minimize erosion of nitride cap 138. Following the formation of oxide spacers 194, recesses 196 are anisotropically etched into the silicon substrate 110 proximate to the gate stack 140 using the gate stack 140, offset and disposable spacers 146 and 154, and oxide spacers 194 as an etch mask. Etching is performed, for example, by reactive ion etching (RIE) using an HBr/O$_2$ chemistry in a manner selective to silicon to avoid excessive erosion of oxide spacer 194 or nitride cap 138. Recesses 196 are etched to a depth of from about 50 nm to about 100 nm and preferably to about 60 nm.

Figure 14:
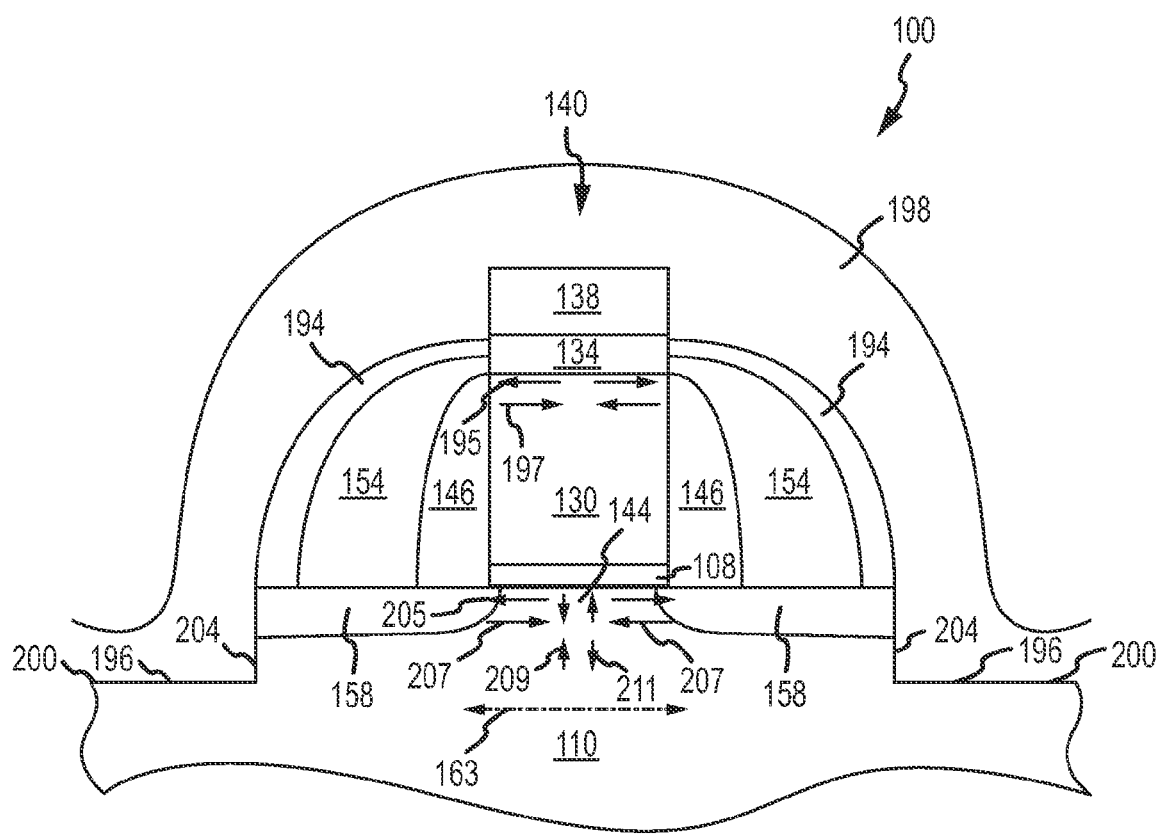
Figure 15:
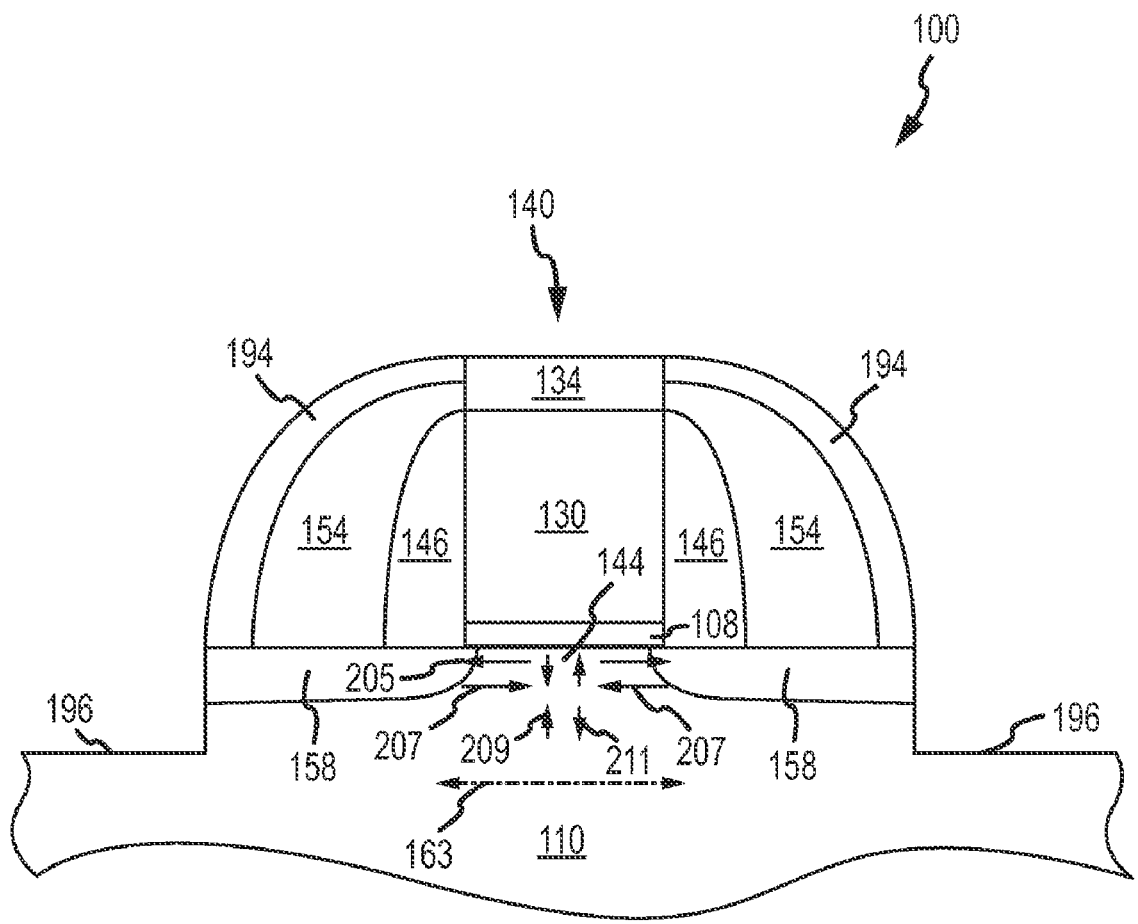

Next, as illustrated in FIG. 14, a stress-inducing layer 198 comprising silicon nitride is blanket deposited overlying MOS transistor 100 including bottom and side surfaces 200 and 204, respectively, of recesses 196. Stress-inducing layer 198 is deposited using a low temperature CVD or PECVD process in a manner that results in a tensile stress-inducing film (for NMOS devices) or a compressive stress-inducing film (for PMOS devices). Stress-inducing layer 198 is formed at a sufficiently low temperature to avoid recrystallization of amorphized gate electrode 130, and has a thickness in a range of from about 30 nm to about 70 nm, and is preferably about 50 nm thick. Following deposition of stress-inducing layer 198, substrate 110 is annealed to activate the extension implant dopant and recrystallize gate electrode 130. The anneal temperature ranges from about 1000° C. to about 1300° C. for a time of from about 5 milliseconds to about 3 seconds, and causes dopants implanted into extensions 158 to diffuse further into substrate 110 and inward toward channel 144. The recrystallization of gate electrode 130 occurs under the influence of tensile stress (indicated by arrows 195) or compressive stress (indicated by arrows 197) imparted by stress-inducing layer 198, and thereby increases (when in tension) or decreases (when in compression) the volume of gate electrode 130. Accordingly, this volume change fixes similar tensile stresses (indicated by arrows 205) or compressive stresses (indicated by arrows 207) within channel 144 upon cooling. In this embodiment, recesses 196 are formed before stress-inducing layer 198 is deposited, and therefore stress-inducing layer 198 forms a deeper shroud overlying MOS transistor 100 than stress-inducing layer 174 of FIG. 7 and, accordingly, may further enhance longitudinal tensile and compressive stresses 205 and 207, respectively. Further, when stress-inducing layer 198 is formed in recesses 196, a compressive stress 209 (for NMOS devices), or a tensile stress 211 (for PMOS devices) is generated substantially orthogonal to longitudinal axis 163 and surface 106 (FIG. 5) of substrate 110. These stresses enhance the mobility of majority carriers in each respective device type and thus have similar beneficial effects to tensile longitudinal stress 205 and compressive longitudinal stress 207. Following the recrystallization anneal, stress-inducing layer 198 and nitride cap 138 are removed as illustrated in FIG. 15 using a hot phosphoric acid etch previously described.

Figure 16:
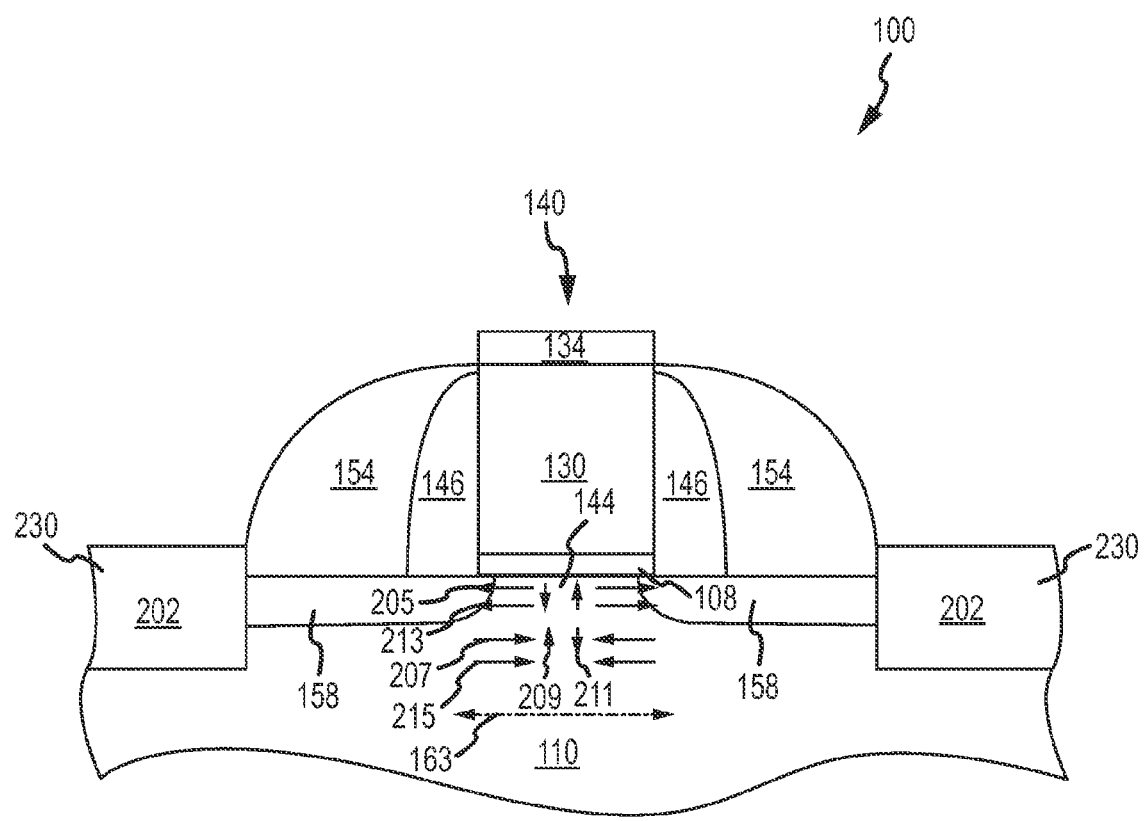
Figure 17:
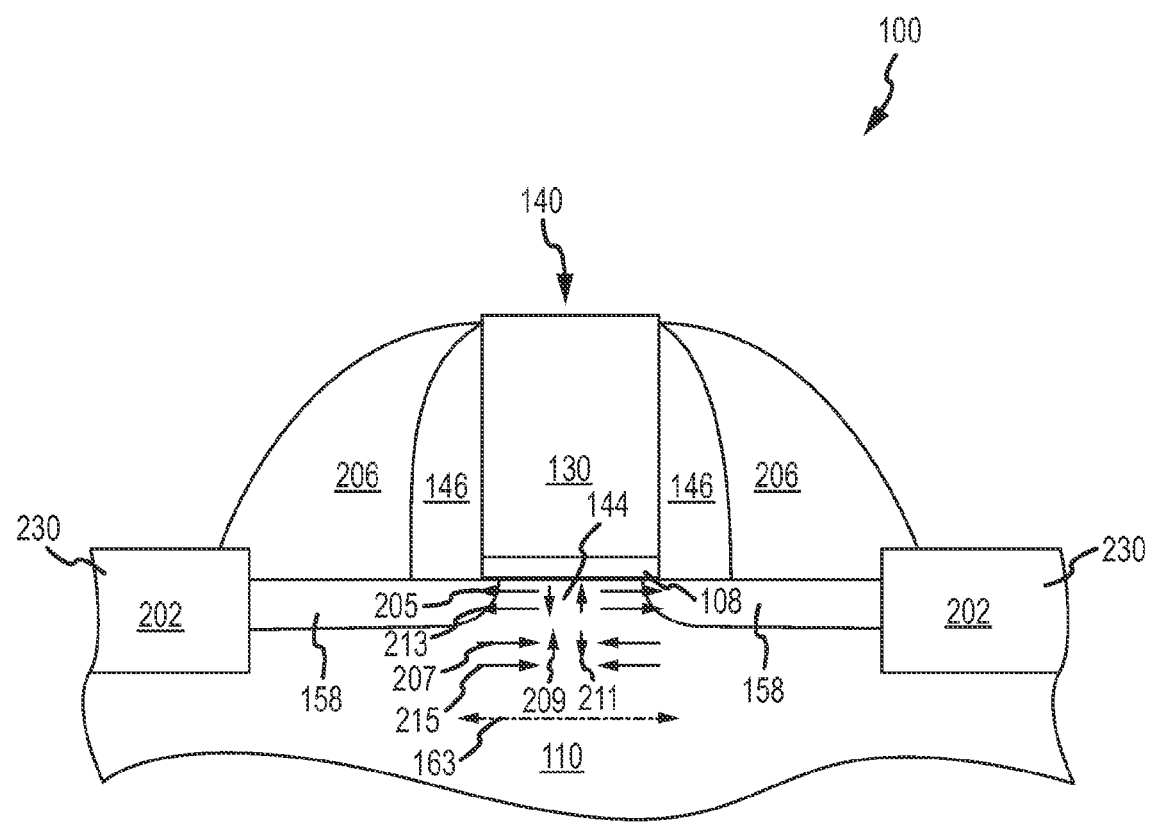
Figure 18:
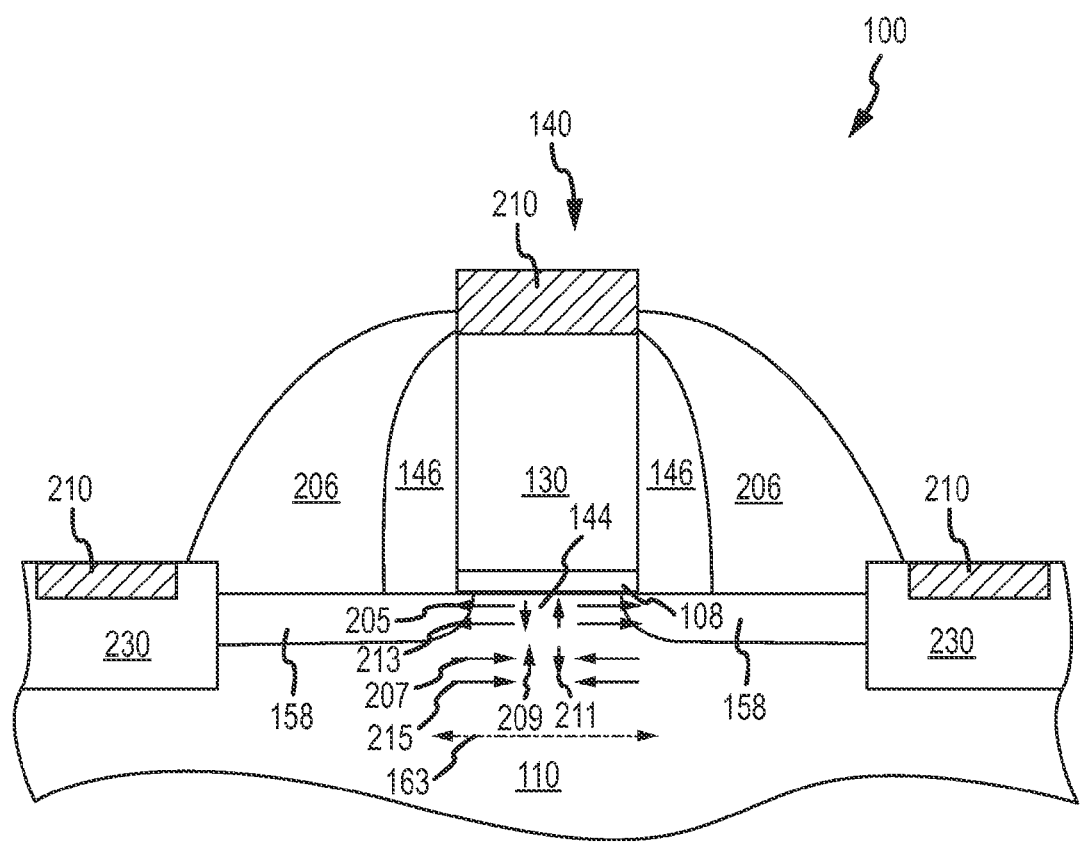

Referring to FIG. 16, exposed surfaces of MOS transistor 100 are cleaned using a dilute hydrofluoric acid etch that also removes oxide spacers 194 and may partially remove oxide cap 134. A silicon-comprising epitaxial film 202 in situ doped with either phosphorous or arsenic (for NMOS) or boron (for PMOS) is then grown within recesses 196 (of FIG. 15) to form deep source and drain regions 230. In one embodiment, for an NMOS device epitaxial film 202 is a tensile stress-inducing material comprising eSi:C that may include up to about 3% carbon and preferably includes about 2% carbon. In another embodiment, for a PMOS device, epitaxial film 202 is a compressive stress-inducing material comprising eSi:Ge that may include up to about 40% germanium, and preferably contains from about 25% to about 35% germanium. Tensile or compressive stresses 213 and 215, respectively, generated by these embedded epitaxial films potentially supplement stresses 205 and 207, respectively, resulting from stress-inducing layer 198. Following epitaxial growth, disposable spacers 154 are removed using a hot phosphoric acid etch previously described. Silicon nitride spacers 206 are formed overlying offset spacers 146, source/drain extensions 158, and a portion of deep source/drain regions 230, as shown in FIG. 17, using blanket deposition and anisotropic etches as previously described. Dilute or buffered hydrofluoric acid is then used to remove oxide cap 134 and clean exposed surfaces of gate electrode 130 and deep source and drain regions 230, removing any surface oxides that may have formed. Metal silicide contact regions 210 may then be formed overlying gate electrode 130 and deep source and drain regions 230, as illustrated in FIG. 18, using well known metal deposition, annealing, and metal etching processes.

Accordingly, the embodiments described herein provide novel methods for applying stress to the channel of either an NMOS or PMOS transistors. These methods allow stresses generated from a sacrificial stress-inducing layer to be compatibly superimposed with stresses generated by embedded epitaxial stress-inducing films to provide enhanced channel stress and improved device performance. This compatibility is achieved by performing gate recrystallization anneals prior to the formation of embedded epitaxial stress-inducing films to avoid relaxing of their stress contribution. Channel stress may be further enhanced by formation of recesses in source and drain regions either before or after deposition of a stress-inducing layer that removes supportive material adjacent to a channel to enhance the strain effect of the deposited stress-inducing layer. Furthermore, when these recesses are formed prior to stress-inducing layer deposition, the stress-inducing layer forms a deeper shroud overlying the MOS transistor transferring greater longitudinally-oriented and vertically-oriented stresses to the channel thereby. Accordingly, these methods result in enhanced longitudinal and vertical stresses in the channels of both PMOS and NMOS devices and can be integrated into a conventional fabrication sequence to provide improved device performance.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of fabricating an MOS transistor on and within a silicon-comprising substrate having a first surface, the method comprising:
   depositing a polysilicon layer overlying the first surface of the silicon-comprising substrate;
   amorphizing the polysilicon layer;
   forming a gate stack comprising a gate electrode fabricated from the polysilicon layer and having sidewalls, the gate stack disposed overlying the first surface of the silicon-comprising substrate;
   forming offset spacers adjacent the sidewalls of the gate electrode;
   etching the first surface of the silicon-comprising substrate using the gate stack and the offset spacers as an etch mask to form recesses in the silicon-comprising substrate, the recesses exposing second surfaces of the silicon-comprising substrate;
   depositing a stress-inducing silicon nitride layer overlying the gate stack, the offset spacers, and the second surfaces;
   annealing the silicon-comprising substrate;
   removing the stress-inducing silicon nitride layer; and
   after removing the stress-inducing silicon nitride layer, epitaxially forming impurity-doped, silicon-comprising regions in the recesses.

2. The method of claim 1, wherein depositing the stress-inducing silicon nitride layer comprises depositing a stress-inducing silicon nitride layer having a thickness in a range of from about 30 nm to about 70 nm.

3. The method of claim 1, wherein depositing the stress-inducing silicon nitride layer comprises depositing a tensile stress-inducing silicon nitride layer.

4. The method of claim 1, wherein depositing the stress-inducing silicon nitride layer comprises depositing a compressive stress-inducing silicon nitride layer.

5. The method of claim 1, wherein etching the first surface comprises etching the first surface to form recesses having a depth in a range of from about 50 nm to about 100 nm.

6. The method of claim 1, wherein epitaxially forming impurity-doped, silicon-comprising regions comprises epitaxially forming impurity-doped, silicon-comprising regions further comprising carbon or germanium.

7. A method for forming a semiconductor device comprising a silicon-comprising substrate, wherein the method comprises:
   depositing a polysilicon layer overlying the silicon-comprising substrate;
   amorphizing the polysilicon layer;
   etching the amorphized polysilicon layer to form a gate electrode;
   etching recesses into the substrate using the gate electrode as an etch mask;
   depositing a stress-inducing layer overlying the gate electrode after etching recesses into the substrate;
   annealing the silicon-comprising substrate;
   removing the stress-inducing layer; and
   after removing the stress-inducing layer, epitaxially growing impurity-doped, silicon-comprising regions in the recesses.

8. The method of claim 7, wherein depositing the stress-inducing layer comprises depositing a compressive stress-inducing layer in the recesses.

9. The method of claim 8, wherein annealing the silicon-comprising substrate results in a longitudinal compressive stress in a channel region underlying the gate electrode, the longitudinal compressive stress being generated by the compressive stress-inducing layer deposited in the recesses.

10. The method of claim 7, wherein depositing the stress-inducing layer comprises depositing a tensile stress-inducing layer in the recesses.

11. The method of claim 10, wherein annealing the silicon-comprising substrate results in a longitudinal tensile stress in a channel region underlying the gate electrode, the longitudinal tensile stress being generated by the tensile stress-inducing layer deposited in the recesses.

12. The method of claim 7, the stress-inducing layer being deposited in the recesses, wherein epitaxially growing impurity-doped, silicon-comprising regions in the recesses supplements stress induced in a channel region underlying the gate electrode by the stress-inducing layer deposited in the recesses.

13. The method of claim 7, wherein annealing the silicon-comprising substrate results in a stress substantially orthogonal to a surface of the silicon-comprising substrate being transferred to a channel region underlying the gate electrode.

14. The method of claim 7, wherein annealing the silicon-comprising substrate is performed after depositing the stress-inducing layer and prior removing the stress-inducing layer.

15. The method of claim 7, wherein etching recesses comprises etching recesses having a depth in a range of from about 50 nm to about 100 nm.

16. A method of fabricating an MOS transistor on and within a silicon-comprising substrate having a first surface, the method comprising:

depositing a polysilicon layer overlying the first surface of the silicon-comprising substrate;

amorphizing the polysilicon layer;

forming a gate stack comprising a gate electrode fabricated from the polysilicon layer and having sidewalls, the gate stack disposed overlying the first surface of the silicon-comprising substrate;

forming offset spacers adjacent the sidewalls of the gate electrode;

etching the first surface of the silicon-comprising substrate using the gate stack and the offset spacers as an etch mask to form recesses in the silicon-comprising substrate;

depositing a stress-inducing silicon nitride layer overlying the gate stack, the offset spacers, and the recesses;

annealing the silicon-comprising substrate;

removing the stress-inducing silicon nitride layer; and after removing the stress-inducing silicon nitride layer, epitaxially forming impurity-doped, silicon-comprising regions in the recesses.

17. The method of claim 16, wherein annealing the silicon-comprising substrate results in a longitudinal stress being transferred from the gate stack to a channel region of the silicon-comprising substrate underlying the gate stack, wherein a longitudinal stress generated by the stress-inducing silicon nitride layer deposited in the recesses supplements the longitudinal stress transferred from the gate stack.

18. The method of claim 16, wherein epitaxially growing impurity-doped, silicon-comprising regions in the recesses supplements stress induced in a channel region underlying the gate stack by the stress-inducing silicon nitride layer deposited in the recesses.

19. The method of claim 16, wherein etching recesses comprises anisotropically etching recess into the silicon-comprising substrate proximate the gate stack.

20. The method of claim 16, wherein annealing the silicon-comprising substrate is performed after depositing the stress-inducing silicon nitride layer and prior to removing the stress-inducing silicon nitride layer.

* * * * *